(12) United States Patent
Hosomi (10) Patent No.: US 7,087,988 B2
(45) Date of Patent: Aug. 8, 2006

(54) SEMICONDUCTOR PACKAGING APPARATUS

(75) Inventor: Eiichi Hosomi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/209,498

(22) Filed: Jul. 30, 2002

(65) Prior Publication Data

US 2004/0021210 A1 Feb. 5, 2004

(51) Int. Cl.
*H01L 23/02* (2006.01)

(52) U.S. Cl. ............ 257/686; 257/777; 257/698

(58) Field of Classification Search ............. 257/698, 257/778, 686, 777, 723, 724
See application file for complete search history.

(56) References Cited

U.S. PATENT DOCUMENTS

| | | | |
|---|---|---|---|
| 4,513,355 A * | 4/1985 | Schroeder et al. | |
| 4,667,219 A * | 5/1987 | Lee et al. | |
| 5,107,329 A * | 4/1992 | Okinaga et al. | |
| 5,237,204 A * | 8/1993 | Val | |
| 5,280,192 A * | 1/1994 | Kryzaniwsky | 257/723 |
| 5,521,435 A * | 5/1996 | Mizukoshi | |
| 5,600,541 A * | 2/1997 | Bone et al. | 361/707 |
| 5,751,063 A * | 5/1998 | Baba | 257/723 |
| 5,889,326 A | 3/1999 | Tanaka | |
| 5,959,348 A | 9/1999 | Chang et al. | |
| 5,977,640 A | 11/1999 | Bertin et al. | |
| 6,100,593 A | 8/2000 | Yu et al. | |
| 6,137,164 A | 10/2000 | Yew et al. | |
| 6,150,724 A | 11/2000 | Wenzel et al. | |
| 6,160,715 A | 12/2000 | Degani et al. | |
| 6,163,458 A | 12/2000 | Li | |
| 6,204,562 B1 | 3/2001 | Ho et al. | |
| 6,229,404 B1 * | 5/2001 | Hatanaka | 331/68 |
| 6,297,548 B1 * | 10/2001 | Moden et al. | 257/686 |
| 6,633,078 B1 * | 10/2003 | Hamaguchi et al. | 257/686 |
| 6,731,009 B1 * | 5/2004 | Jones et al. | 257/777 |
| 6,774,473 B1 * | 8/2004 | Shen | 257/686 |
| 6,777,798 B1 * | 8/2004 | Fukumoto et al. | 257/686 |
| 6,830,960 B1 * | 12/2004 | Alcoe et al. | 438/122 |

FOREIGN PATENT DOCUMENTS

| | | |
|---|---|---|
| EP | 1 111 676 | 6/2001 |
| EP | 1 122 786 | 8/2001 |
| EP | 1 189 282 | 3/2002 |
| JP | 10-079405 | 3/1998 |
| JP | 11-204944 | 7/1999 |
| JP | 11-340416 | 12/1999 |
| JP | 2001-244406 | 9/2001 |
| JP | 2001-291820 | 10/2001 |
| JP | 2001-319997 | 11/2001 |
| WO | 01/71806 | 9/2001 |

* cited by examiner

*Primary Examiner*—S. V. Clark
(74) *Attorney, Agent, or Firm*—Hogan & Hartson, LLP (57) ABSTRACT

An exemplary embodiment of the present invention described and shown in the specification and drawings is a semiconductor packaging apparatus that includes a first substrate for coupling to an electronic component, and a second substrate for accommodating the electronic component coupled to the first substrate.

22 Claims, 9 Drawing Sheets

SEMICONDUCTOR PACKAGING APPARATUS

FIELD OF THE INVENTION

The present invention relates to a semiconductor package, and in particular, to a single semiconductor package capable of accommodating a semiconductor die.

BACKGROUND OF THE INVENTION

Currently, multi-chip module configurations are used in the packaging of semiconductor devices. A multi-chip module configuration provides for the mechanical and electrical interconnection between more than one semiconductor die in a common package. The package, in turn, is mounted to another printed circuit board referred to as a motherboard that contains other electronic systems with which the multi-chip module configuration interfaces. In some cases, semiconductor dies directly interconnect to one another. In other cases, semiconductor dies are mounted on opposing surfaces of a substrate and the semiconductor dies are electrically coupled to one another by means of traces and vias in the substrate. As the length of the substrate's traces and vias is shortened, the corresponding values of resistance, inductance, and capacitance reduce, and the efficiency of the electrical coupling between the semiconductor dies increases. Therefore, multi-chip module configurations often offer improved system performance including reduced noise, reduced power consumption, better signal integrity and power distribution, and increased bandwidth.

Figure 1:
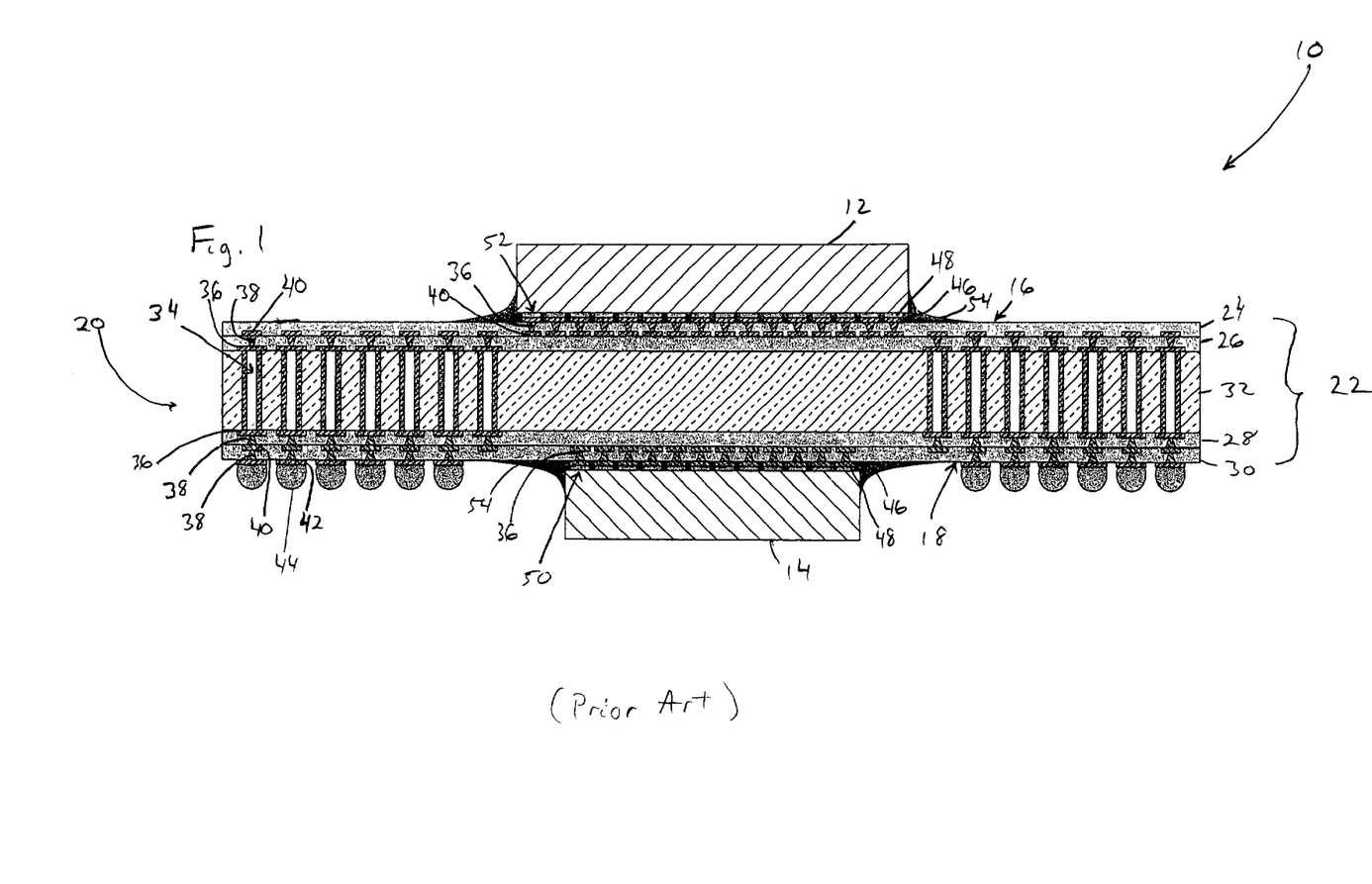
FIG. 1 is a cross-sectional view illustrating a conventional multi-chip module configuration.

An example of a multi-chip module configuration 10 in which two semiconductor dies 12 and 14 are mounted on opposing surfaces 16 and 18 of a substrate 20 is illustrated in FIG. 1. The substrate includes a top surface 16 and a bottom surface 18. Also, the substrate is composed of multiple layers 22 of material that are formed by the well known processes used to create integrated circuits and printed circuit boards. The individual layers may be comprised of conductive or insulator material layers. Often, the conductive material is a metal, e.g., a copper-based material, which is plated onto insulator material layers and patterned by photolithographically removing deposited metal to form pads and traces. The substrate may be referred to as organic if organic material is combined with the copper-based material so as to provide thermal expansion characteristics close to those of the motherboard (not shown) and to improve reliability in board assembly.

In the example depicted in FIG. 1, the top two layers 24 and 26 and the bottom two layers 28 and 30 of the substrate 20 are formed by a lamination process from a thin resin material. The middle layer 32 located between the two top layers 24 and 26 and the two bottom layers 28 and 30 is called the core layer and is made of conventional printed circuit board material. The middle layer 32 includes middle layer through holes (not shown) used for electrically coupling the two top layers 24 and 26 to the two bottom layers 28 and 30. During fabrication of the substrate, the top two layers 24 and 26, the bottom two layers 28 and 30, and the middle layer 32 are laminated together.

As illustrated in FIG. 1, the middle layer 32 includes metal-plated through holes 34 that are formed by mechanical drilling through the middle layer. Pads 36 are located at the opposing ends of each through hole. The top and bottom layers 24, 26, 28, and 30 include microvias 38 which are formed by laser drilling the top two layers 24 and 26 and bottom two layers 28 and 30. Therefore, the various layers 22 of the substrate require multiple processing steps to do both mechanical and laser drilling. Also, each of the microvias 38 in the top two layers 24 and 26 and the bottom two layers 28 and 30 requires a separate laser drilling step. So, the total cost to fabricate both the through holes and microvias increases as the total number of mechanical and laser drilling steps increases.

Microvia interface pads 40 are coupled to the microvias 38 in the substrate's top layers and bottom layers 24, 26, 28 and 30. Each microvia is electrically coupled to a metal-plated through hole 34 by means of a pad 36. Pads 42 are formed on the bottom surface 18 of the substrate 20 and are mechanically and electrically coupled to microvias in the bottom two layers 28 and 30 of the substrate. Ball Grid Array ("BGA") solder balls 44 are coupled to the pads 42 on the bottom surface of the substrate. Typically, the pads on the bottom surface of the substrate are coupled via the BGA solder balls to corresponding pads (not shown) on the motherboard (not shown). Die interface pads 46 are also located on both the bottom and top surfaces 18 and 16 of the substrate for interfacing with the first semiconductor die 14 and a second semiconductor die 12, respectively. The die interface pads are mechanically and electrically coupled to microvias in both the top and bottom layers 24, 26, 28, and 30 of the substrate. Microvia interface pads are correspondingly located below the microvias in the substrate's top layer 24 and above the microvias in the substrate's bottom layer 30.

The first semiconductor die 14 is mechanically and electrically coupled to the bottom surface 18 of the substrate 20. Also, the second semiconductor die 12 is mechanically and electrically connected to the top surface 16 of the substrate. Metallic bumps 48 on the bottom surfaces 50 and 52 of both the first and second semiconductor dies 14 and 12, respectively, overlap with die interface pads 46 correspondingly positioned on the bottom surface 18 and top surface 16 of the substrate, respectively. Typically, the metallic bumps are connected to the die interface pads by solder, thus providing direct electrical coupling between each of the first and second semiconductor dies and the substrate. Thus, the substrate provides for a mechanical and electrical interface between the often densely packed metallic bumps on the bottom surfaces 50 and 52 of both the first and second semiconductor dies to the less-densely packed pads (not shown) on the motherboard (not shown).

FIG. 1 also illustrates underfill resin 54 deposited between the first semiconductor die 14 and the bottom surface 18 of the substrate 20 and between the second semiconductor die 12 and the top surface 16 of the substrate. The underfill resin is a thermosetting polymer compound that includes thermally conductive compounds and electrically insulating material. After curing, the underfill resin strengthens the mechanical interface between each of the first and second semiconductor dies and the substrate by diverting much of the shear stress applied to the first and second semiconductor dies, e.g., shear stress due to vibration, and stress from the difference in thermal expansion between the first and second semiconductor dies and the substrate, away from the solder joints that interconnect the first and second semiconductor dies to the substrate and distributing the stress across the entire multi-chip module configuration 10. Therefore, the underfill resin increases mechanical reliability by reducing the likelihood of the electrical interfaces between the first and second semiconductor dies and the substrate being compromised due to mechanical stresses and vibration. The underfill resin also helps to dissipate heat from the semiconductor dies to the substrate.

Multi-chip module configurations 10 often include decoupling capacitors (not shown) that are used to reduce simultaneous switching noise ("SSN"). Since it is necessary to keep the loop inductance to the decoupling capacitors low, the distance between a semiconductor die 12 and 14 and the decoupling capacitors should be as short as possible. Therefore, the decoupling capacitors are often positioned on the surface of the substrate 20 that opposes the surface of the substrate to which the semiconductor die is coupled. The decoupling capacitors are electrically coupled to the semiconductor die by means of vias and traces (not shown) included in the substrate.

As stated above, the multi-chip module configuration 10 of FIG. 1 offers the benefit of improved electrical performance. However, the first semiconductor die 14, or decoupling capacitor (not shown), coupled to the bottom surface 18 of the substrate 20 likely will contact the surface (not shown) of the motherboard (not shown) when the multi-chip module is connected to the motherboard. The first semiconductor die or decoupling capacitor likely will contact the motherboard because the height of the BGA solder balls 44 are typically only 0.4 to 0.6 millimeter in height while the first semiconductor die or decoupling capacitor is typically greater than 0.7 millimeter in height.

In order to avoid this height differential problem, a column grid array ("CGA") (not shown), typically 1.5 to 2.0 millimeters in height can be used instead of BGA solder balls 44 to couple the multi-chip module 10 to the motherboard (not shown). If a CGA is coupled to the bottom surface 18 of the substrate 20, the first semiconductor die 14 or decoupling capacitor (not shown) will not contact the surface (not shown) of the motherboard. However, installation of a CGA is complicated by the need for specialized installation equipment that is not widely available.

Another possible solution to the height differential problem is to glind the first semiconductor die 14, and thus, reduce the thickness of the first semiconductor die. However, the process of glinding the first semiconductor die is costly. Also, the glinding process cannot be applied to decoupling capacitors (not shown) because glinding would result in the removal of a portion of the multiple layers of ceramic and conductors that form each decoupling capacitor.

An additional possible solution to the height differential problem is to use thin decoupling capacitors. However, thin decoupling capacitors are typically costly in comparison to regular decoupling capacitors.

A further possible solution to the height differential problems is to fabricate a recess (not shown) or hole (not shown) in the motherboard (not shown) to accommodate the first semiconductor die 14 or decoupling capacitor (not shown). However, adding a recess or hole in the motherboard disadvantageously removes surface area from the motherboard that could be used for routing traces (not shown) or configuring vias below the first semiconductor die and/or decoupling capacitors.

An additional disadvantage associated with the multi-chip module configuration 10 of FIG. 1 is that the underfill resin 54 spreads out from under the first and second semiconductor dies 14 and 12, and away from the first and second semiconductor dies as the underfill resin is deposited between the first and second semiconductor dies, and the substrate 20. The spread of the underfill resin can extend up to 2 to 3 millimeters away from the first and second semiconductor dies. Because of the spread of the underfill resin, pads 42 for interfacing with BGA solder balls 44 cannot be located in the region of the substrate nearest the first and second semiconductor dies. As such, the dimensions of the substrate must be increased to leave margin space for the estimated spread of the underfill resin, which disadvantageously results in increased material cost in fabricating the substrate. Also, the increased separation between the first and second semiconductor dies and the BGA solder ball interface with the motherboard (not shown) disadvantageously counter acts the benefits associated with having shortened electrical connections between the first and second semiconductor dies and the motherboard.

Therefore, there is a need for a multi-chip module configuration 10 which prevents the semiconductor dies 12 and 14 or decoupling capacitors (not shown) coupled to the bottom surface 18 of the substrate 20 from contacting the motherboard (not shown) without the need of a column grid array (not shown), the need to glind the semiconductor dies, or the need to remove a portion of the motherboard. Also, there is a need for a multi-chip module configuration that has a fewer number of microvias 38 that are costly to fabricate. In addition, there is a need for a multi-chip module configuration that limits the spread of the underfill resin 54, and thus, provides greater surface area on the substrate for locating pads 42 and allows for locating pads 42 closer to the semiconductor die.

SUMMARY OF THE INVENTION

In one aspect of the present invention, a semiconductor packaging apparatus includes a first substrate for coupling to an electronic component; and a second substrate for accommodating the electronic component coupled to the first substrate.

In another aspect of the present invention, a semiconductor module includes a first substrate having opposing surfaces, a first electronic component, and a second substrate. The first electronic component is coupled to one of the opposing surfaces of the first substrate. The second substrate accommodates the first electronic component and is coupled to one of the opposing surfaces of the first substrate.

In another aspect of the present invention, a semiconductor module includes a first substrate having opposing surfaces, a first electronic component, and a cap substrate. The first electronic component is coupled to one of the opposing surfaces of the first substrate. The cap substrate accommodates the first electronic component and is coupled to the one of the opposing surfaces of the first substrate.

It is understood that other aspects of the present invention will become readily apparent to those skilled in the art from the following detailed description, wherein is shown and described only exemplary embodiments of the invention, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Various features, aspects, and advantages of the present invention will become better understood with regard to the following description, appended claims, and accompanying drawings where:

FIG. 3f is a cross-sectional view of a fabrication step for the multi-chip module configuration of FIG. 2;

FIG. 3g is a cross-sectional view of a fabrication step for the multi-chip module configuration of FIG. 2;

FIG. 3h is a cross-sectional view of a fabrication step for the multi-chip module configuration of FIG. 2;

FIG. 3i is a cross-sectional view of a fabrication step for the multi-chip module configuration of FIG. 2;

DETAILED DESCRIPTION OF THE PREFERRED EMBODIMENTS

Figure 2:
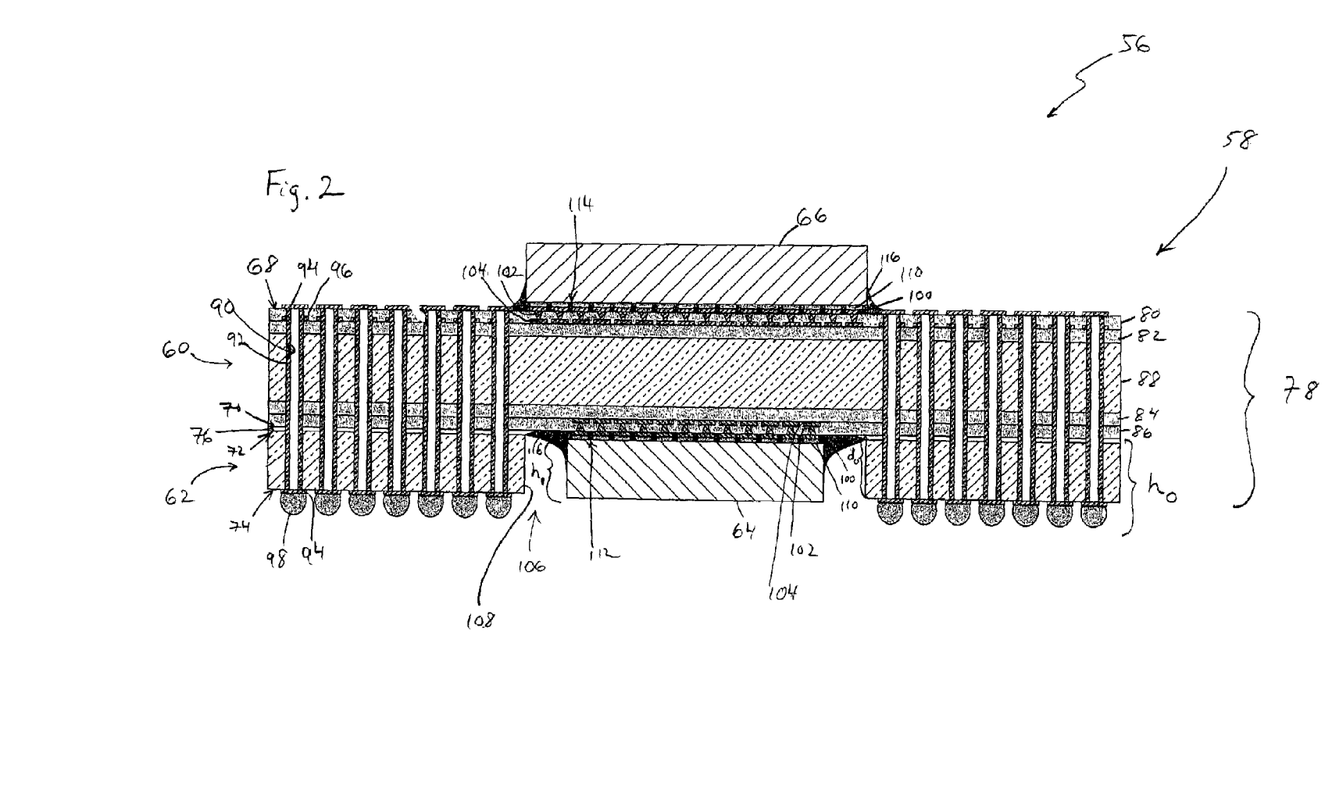
FIG. 2 is a cross-sectional view of a multi-chip module configuration in accordance with an exemplary embodiment of the present invention.

FIG. 2 illustrates an exemplary embodiment of a multi-chip module configuration 56. The multi-chip module configuration includes a substrate packaging apparatus 58 made up of a first substrate 60 and a second substrate 62, a first semiconductor die 64, and a second semiconductor die 66. The first substrate has a top surface 68 and an opposing bottom surface 70. Similarly, the second substrate has a top surface 72 and an opposing bottom surface 74. The first substrate's bottom surface 70 is coupled to the second substrate's top surface 72 by means of a lamination process that forms a lamination layer 76. However, the first substrate and the second substrate may be coupled together by mechanical means other than lamination, e.g., adhesive or attachment devices.

Both the first substrate 60 and the second substrate 62 are composed of multiple layers 78 of material that are formed by the well known processes used to create integrated circuits and printed circuit boards. The individual layers that comprise the first substrate may be comprised of conductive or insulator material layers. Often, the conductive material is a metal, e.g., a copper-based material, which is plated onto insulator material layers and patterned by photolithographically removing deposited metal to form pads and traces. The first substrate is referred to as organic because organic material in the first substrate is combined with the copper-based material so as to provide thermal expansion characteristics close to those of the motherboard (not shown) and to improve reliability in board assembly.

In the embodiment shown in FIG. 2, the top two layers 80 and 82 and bottom two layers 84 and 86 of the first substrate 60 were designed using fine ground rules that can be applied to organic material. The top two layers 80 and 82 and the bottom two layers 84 and 86 of the first substrate are formed by a lamination process from a thin resin material called ABF (Ajinomoto Build-up Film) manufactured by Ajinomoto Fine Techno Co., Inc. located in Kawasaki, Japan. The middle layer 88 of the first substrate is located between the two top layers 80 and 82 and the two bottom layers 84 and 86 and is called the core layer. The middle layer 88 includes middle layer through holes (not shown) used for electrically coupling the two top layers 80 and 82 to the two bottom layers 84 and 86. During fabrication of the first substrate, the top two layers 80 and 82, the bottom two layers 84 and 86, and the middle layer 88 are laminated together. In contrast to the first substrate, the second substrate 62 is only made of conventional printed circuit board material, a typical example of the printed circuit board material is named BT resin which is manufactured by Mitsubishi Gas Chemical Co., Inc. located in Tokyo, Japan. Rough ground rules, which are less expensive to implement than fine ground rules, were used during the design of the second substrate.

Both the first substrate 60 and the second substrate 62 include through holes 90 that penetrate through both the first and the second substrates. The through holes are formed by mechanical drilling and are plated with a metal 92, e.g., copper. Pads 94 made of metal, e.g. copper, are located on the top surface 68 of the first substrate and the bottom surface 74 of the second substrate at the opposing ends of the through holes. Side portions 96 of pads 94 through which through holes 90 were drilled are located on either side of each through hole below the top surface 68 of the top layer 80 of the first substrate. BGA solder balls 98 are coupled to the pads 94 on the bottom surface 74 of the second substrate. Typically the BGA solder balls are fabricated from tin/lead solder, however, other types of solder may be used, e.g., lead-free solders and conductive polymers. The total height $h_0$ of the second substrate in combination with the BGA solder balls is designed to be greater than the height $h_1$ of the first semiconductor die 64.

Die interface pads 100 made of metal, e.g., copper, are located on both the top and bottom surfaces 68 and 70 of the first substrate 60. The die interface pads are mechanically and electrically coupled to microvias 102 made of metal, e.g. copper, in both the top layer 80 and bottom layer 86 of the first substrate. Microvia interface pads 104 made of metal, e.g. copper, are correspondingly located below the microvias in the first substrate's top layer 80 and above the microvias in the first substrate's bottom layer 86.

The second substrate 62 is ring-shaped and has a hole 106 having dimensions that accommodate electronic components such as the first semiconductor die 64 and/or decoupling capacitor (not shown). In accommodating the first semiconductor die, the dimensions of the hole in the second semiconductor substrate are such that the first semiconductor die can be coupled to the bottom surface 70 of the first substrate 60 and the height $h_1$ of the first substrate die is not greater than the height $h_0$ of the second substrate and the BGA solder balls 98. FIG. 2 and all subsequently discussed figures are cross-sectional views taken through the region of the second substrate having the hole. The shape of the hole in the second substrate is defined by an inner wall 108. The hole may be of any shape, however, during the following discussion, it is assumed that the hole is rectangular so as to closely accommodate the dimensions of a rectangular first semiconductor die. Furthermore, the depth $d_0$ of the hole may be any depth so long as the first substrate die does not extend beyond the height $h_0$ of the second substrate and the BGA solder balls. The dimensions of the hole are such that the distance between the first semiconductor die and the inner wall of the second substrate is less than 1.5 millimeters. In additional embodiments, instead of having a hole, the second substrate may include a recess to accommodate the first semiconductor die. In other embodiments, the second substrate may have a shape other than ring-shaped, e.g., the second substrate may be U-shaped, L-shaped, or in the shape of a dual rail, so long as the second substrate accommodates the first semiconductor die.

The first semiconductor die 64 is mechanically and electrically coupled to the bottom surface 70 of the first substrate 60. Also, the second semiconductor die 66 is mechanically and electrically coupled to the top surface 68 of the first substrate. Metallic bumps 110 on the bottom surface 112 and 114 of both the first semiconductor die 64 and second semiconductor die 66 overlap with die interface pads correspondingly positioned on the bottom 70 and top surfaces 68 of the first substrate, respectively. The metallic bumps on bottom surface 112 of the first substrate and bottom surface 114 of the second substrate are connected to the die interface pads by solder, thus providing direct electrical coupling between each of the first and second semiconductor dies and the first substrate. In addition, the microvias 102 in combination with traces (not shown), the plated through holes 90, and the BGA solder balls 98 provide for electrical coupling between the first semiconductor die, the second semiconductor die, and the motherboard (not shown).

Underfill resin 116 is located between the first semiconductor die 64 and the bottom surface 70 of the first substrate 60, and between the second semiconductor die 66 and the top surface 68 of the first substrate. As shown in FIG. 2, the inner wall of the second substrate 62 limits the spread of the underfill resin away from the first semiconductor die 64.

Figure 3A:
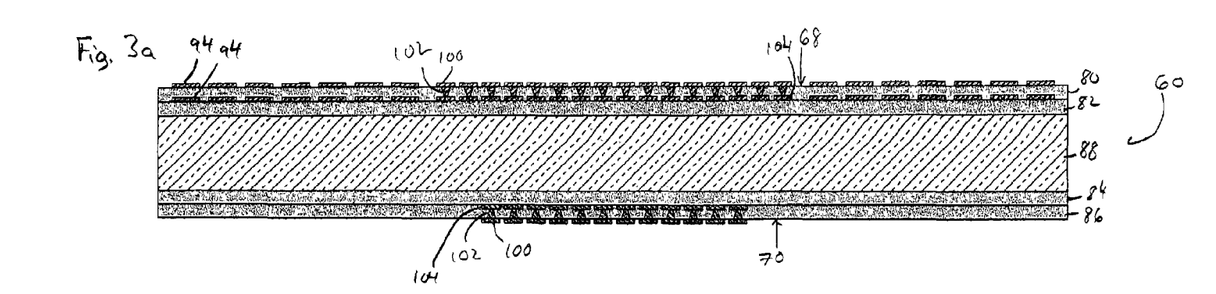
FIG. 3a is a cross-sectional view of a fabrication step for the multi-chip module configuration of FIG. 2.

FIGS. 3a through 3j are cross-sectional diagrams illustrating a fabrication sequence for the multi-chip module configuration 56 illustrated in FIG. 2. As shown in FIG. 3a, the first substrate 60 is fabricated using build-up technology including the previously mentioned lamination process resulting in the two top layers 80 and 82 and two bottom layers 84 and 86 laminated on either side of the middle layer 88. The middle layer 88 includes middle layer through holes (not shown) used for electrically coupling the two top layers 80 and 82 to the two bottom layers 84 and 86. Also, FIG. 3a illustrates that during the build-up process of the first substrate, die interface pads 100 are formed on both the top surface 68 and bottom surface 70 of the first substrate, and corresponding microvias 102 and microvia interface pads 104 are formed in the top layer 80 and bottom layer 86 of the first substrate. Finally, FIG. 3a also shows that pads 94 have been formed on top of both of the two top layers 80 and 82 of the first substrate.

Figure 3B:
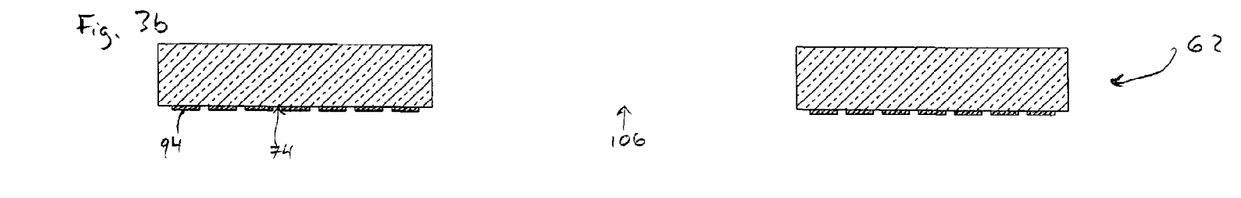
FIG. 3b is a cross-sectional view of a fabrication step for the multi-chip module configuration of FIG. 2.
Figure 3C:
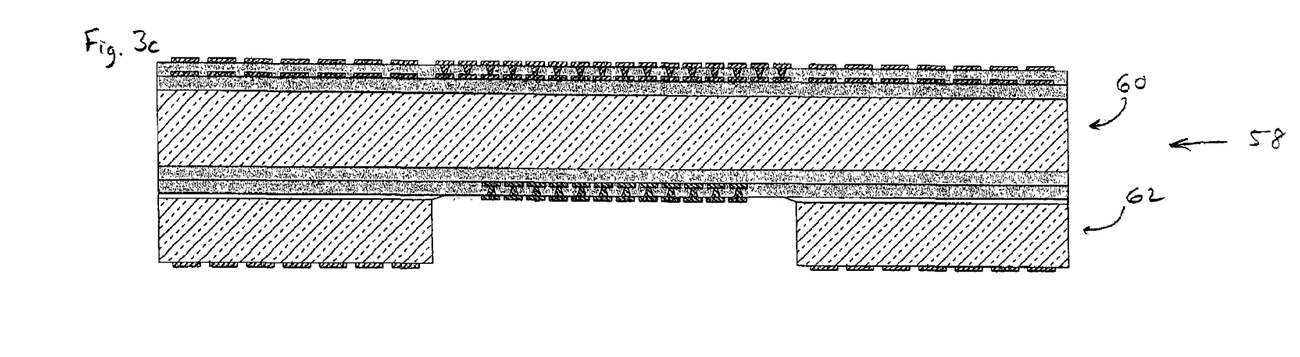
FIG. 3c is a cross-sectional view of a fabrication step for the multi-chip module configuration of FIG. 2.

FIG. 3b illustrates a cross-sectional view of the second substrate 62 and hole 106. As mentioned previously, the second substrate is fabricated based on conventional printed circuit board technology. Pads 94 for interfacing with BGA solder balls 98 are formed on the bottom surface 74 of the second substrate. The first substrate 60 depicted in FIG. 3a and the second substrate depicted in FIG. 3b are laminated together forming the substrate packaging apparatus 58 as illustrated in FIG. 3c.

Figure 3D:
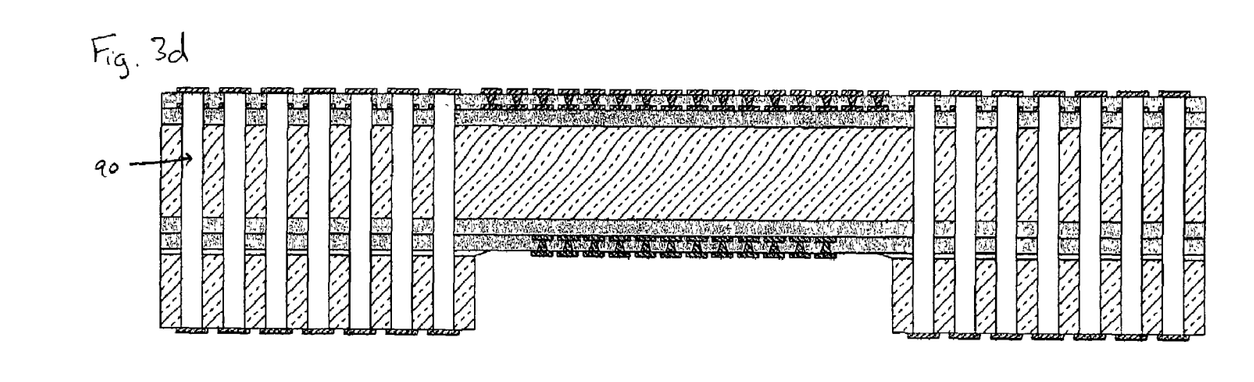
FIG. 3d is a cross-sectional view of a fabrication step for the multi-chip module configuration of FIG. 2.
Figure 3E:
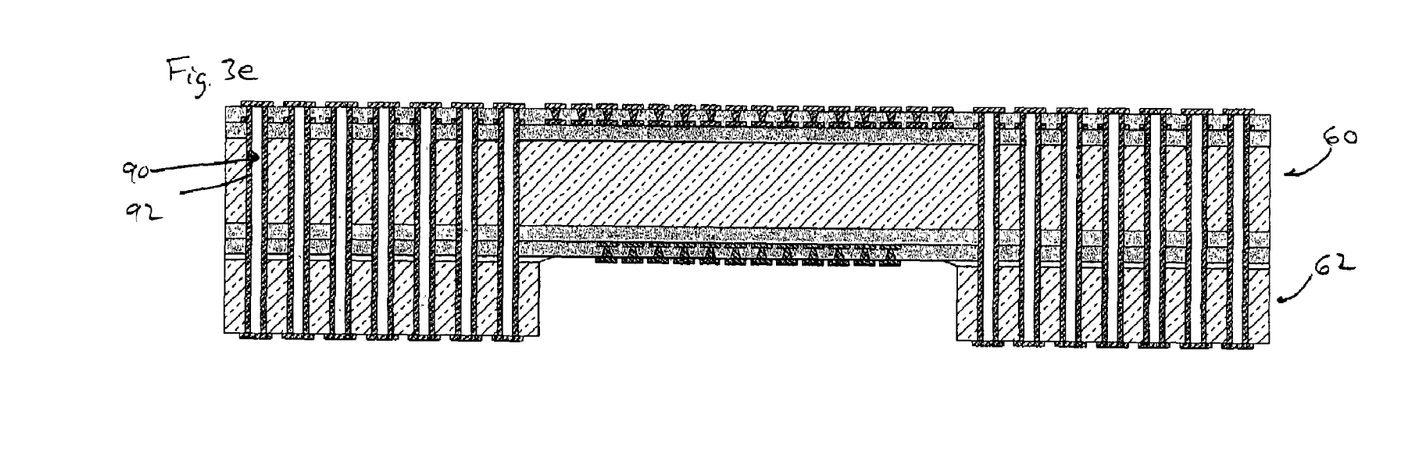
FIG. 3e is a cross-sectional view of a fabrication step for the multi-chip module configuration of FIG. 2.

After laminating the first and second substrates 60 and 62 together to form the substrate packaging apparatus 58, through holes 90 are formed through both the first and second substrates as shown in FIG. 3d at the same time by means of mechanical drilling. Next, referring to FIG. 3e, the inside surfaces of the through holes are plated with metal 92, e.g., copper, so as to provide for electrical coupling between the first substrate 60 and the second substrate 62. During fabrication, there may be many substrate packaging apparatuses 58 configured side by side in one panel (not shown) which are separated into a plurality of separate packaging apparatuses during a singulation process in which the substrate packaging apparatuses are separated from one another using a dicer or router.

Next, referring to FIG. 3f, the second semiconductor die 66 is coupled to the top surface 68 of the first substrate 60 by soldering the metallic bumps 110 on the bottom surface 114 of the second semiconductor die to the die interface pads 100 on the top surface of the first substrate, thus, providing a mechanical and electrical interface between the first substrate and the second semiconductor die. After the second semiconductor die is coupled to the top surface of the first substrate, underfill resin 116 is deposited between the first semiconductor die and the top surface of the first substrate as shown in FIG. 3g.

Figure 3J:
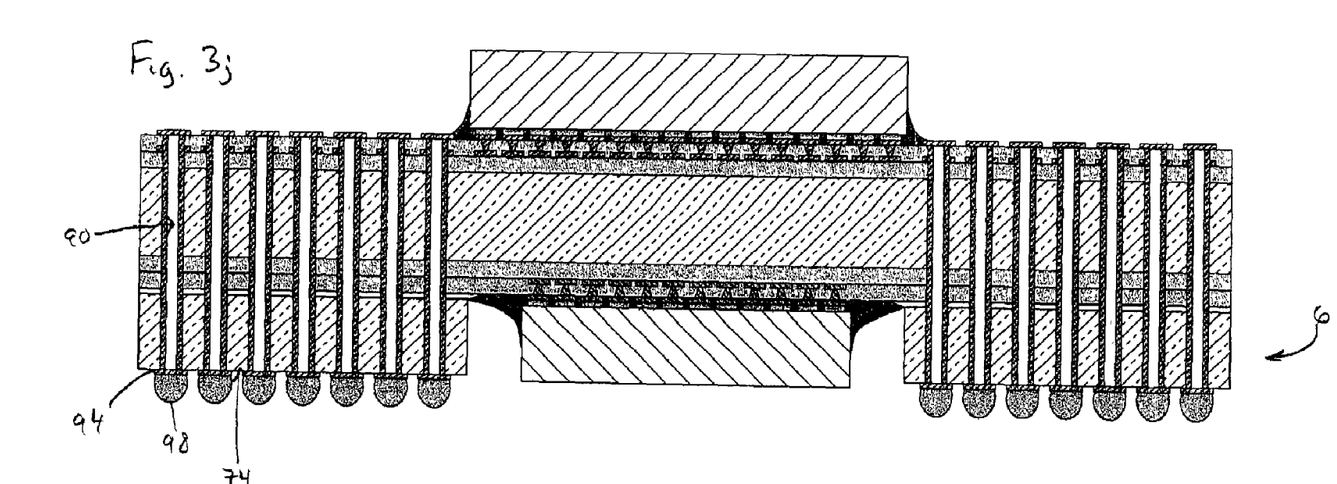
FIG. 3j is a cross-sectional view of a fabrication step for the multi-chip module configuration of FIG. 2.

The first semiconductor die 64 is then inserted through the hole 106 in the second substrate 62, and the metallic bumps 110 on the bottom surface 112 of the first semiconductor die are soldered onto the die interface pads 100 located on the bottom surface 70 of the first substrate 60 as indicated in FIG. 3h. Referring to FIG. 3i, underfill resin 116 is deposited between the first semiconductor die 64 and the bottom surface 70 of the first substrate. As shown in FIG. 3i, the spread of the underfill resin is limited by the inner wall 108 of the second substrate's hole. Lastly, as shown in FIG. 3j, BGA solder balls 98 are attached to the pads 94 on the bottom surface 74 of the second substrate so that each BGA solder ball is coupled to a corresponding plated through hole 90.

While FIGS. 3f–3i depict the coupling of the second semiconductor die 66 to the top surface 68 of the first substrate 60 followed by the coupling of the first semiconductor die 64 to the bottom surface 70 of the first substrate 60, the order of coupling the first and second semiconductor dies 64 and 66 may be reversed such that the first semiconductor die 64 is coupled to the bottom surface 70 of the first substrate 60 before the second semiconductor die 66 is coupled to the top surface 68 of the first substrate 60.

Figure 4:
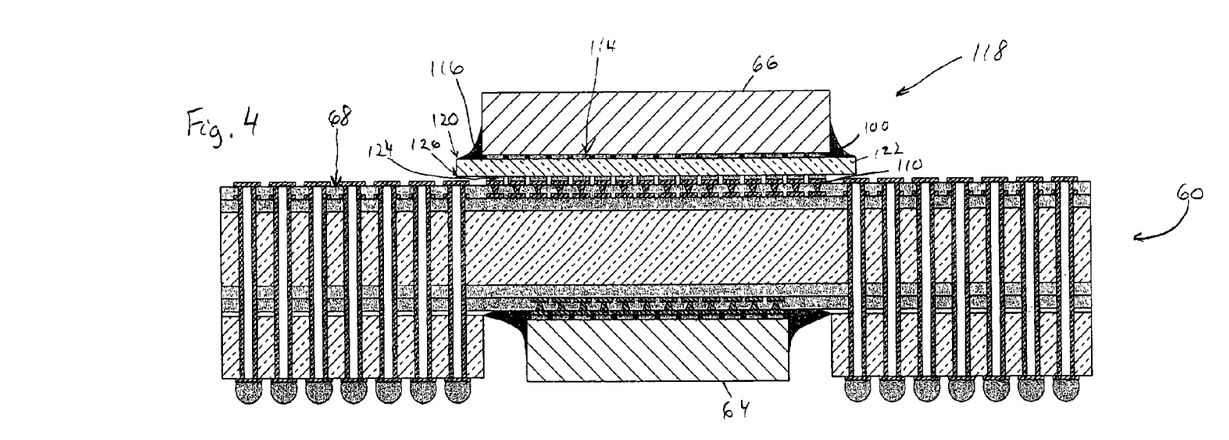
FIG. 4 is a cross-sectional view of a multi-chip module configuration in accordance with an exemplary embodiment of the present invention.

The exemplary embodiment of FIG. 4 differs from the embodiment shown in FIG. 2 in that rather than soldering the metallic bumps 100 on the bottom surface 114 of the second semiconductor die 66 directly to die interface pads 110 on the top surface 68 of the first substrate 60, the second semiconductor die is configured in a pre-package assembly 118 that is coupled to the first substrate. As shown in FIG. 4, the second semiconductor dies includes metallic bumps located on the bottom surface of the second semiconductor die which are soldered to pads (not shown) on the top surface 120 of an interface substrate 122. Pads 124 on the bottom surface 126 of the interface substrate are connected to corresponding die interface pads 110 by means of solder connections. Traces (not shown) and vias (not shown) in the interface substrate electrically couple the pads (not shown) on the top surface 120 of the interface substrate to the pads 124 on the bottom surface 126 of the interface substrate 122. Underfill resin 116 is deposited between the bottom surface 114 of the second semiconductor die and the top surface 120 of the interface substrate. Even though FIG. 4 only shows the second semiconductor die configured in a pre-package assembly, other embodiments of the present invention may include the first semiconductor die 64 configured in a pre-packaging assembly. Configuring the first semiconductor die and/or the second semiconductor die in a pre-package assembly advantageously facilitates diagnostic evaluation of the quality of the first or second semiconductor die before it is coupled to the first substrate.

Figure 5:
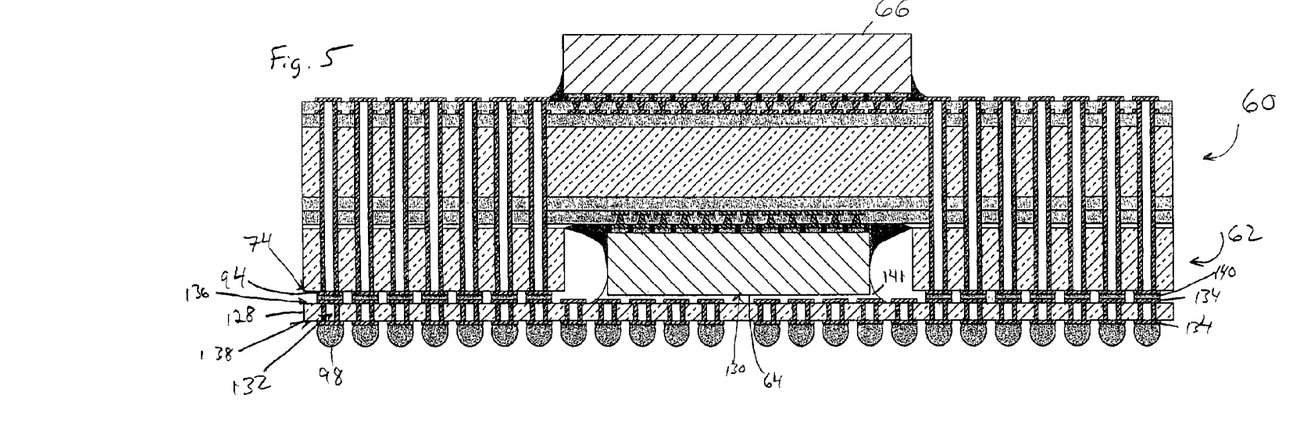
FIG. 5 is a cross-sectional view of a multi-chip module configuration in accordance with an exemplary embodiment of the present invention.

The exemplary embodiment of FIG. 5 differs from the embodiment of FIG. 2 in that the embodiment of FIG. 5 includes a thermal substrate 128 which is coupled to the pads 94 on the bottom surface 74 of the second substrate 62 instead of the BGA solder balls 98. Also, the top surface of the first semiconductor die is mechanically coupled to the thermal substrate in FIG. 5. The thermal substrate is made of conventional printed circuit board material, as discussed previously, and includes metal-plated through holes 132, typically plated with copper. Pads 134 are located on both the top surface 136 and bottom surface 138 of the thermal substrate. The pads 94 on the bottom surface 74 of the second substrate are coupled to corresponding pads 134 on the top surface 136 of the thermal substrate by means of solder connections 140. A thermal conductive material 141, for example, G750 which is manufactured by Shin-etsu Chemical Co., Ltd. located in Tokyo, Japan, is deposited between the top surface of the first semiconductor die and the thermal substrate so as to provide mechanical and thermal contact between the first semiconductor die and the thermal substrate. BGA solder balls 98 are connected to the pads 134 on the bottom surface 138 of the thermal substrate. The thermal substrate's metal-plated through holes 132 and pads 134 advantageously provide for thermal conduction from the first and second semiconductor dies 64 and 66 and the first and second substrates 60 and 62 through the BGA solder balls into the motherboard (not shown).

Figure 6:
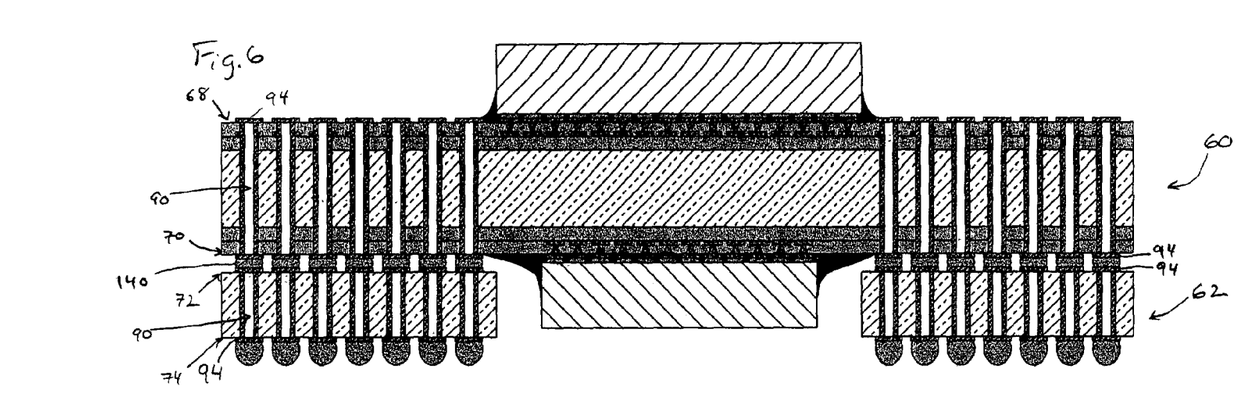
FIG. 6 is a cross-sectional view of a multi-chip module configuration in accordance with an exemplary embodiment of the present invention.

The exemplary embodiment of FIG. 6 differs from the embodiment of FIG. 2 since in FIG. 6 the first substrate 60 is coupled to the second substrate 62 by means of solder connections 140 rather than laminating the bottom surface 70 of the first substrate to the top surface 72 of the second substrate as in the embodiment of FIG. 2. During fabrication, the first substrate and second substrate in FIG. 6 each have their through holes 90 drilled and plated separate from one another. In addition to having pads 94 on the top surface 68 of the first substrate, the bottom surface 70 of the first substrate also has pads 94 that mechanically and electrically couple to the copper-plated through holes. Further, the top surface 72 of the second substrate includes pads 94 that mechanically and electrically couple to the copper-plated through holes in addition to the pads 94 on the bottom surface 74 of the second substrate. The pads 94 on the bottom surface 70 of the first substrate are coupled to the pads 94 on the top surface 72 of the second substrate by means of solder connections 140.

Furthermore, the embodiment of FIGS. 5 and 6 may be combined resulting in an exemplary embodiment in which the first and second substrates 60 and 62 are coupled together by means of solder connections 140 as depicted in FIG. 6 and a thermal substrate 128 is coupled to the bottom surface 74 of the second substrate by means of solder connections 140 and the top surface 130 of the first semiconductor die 64 by means of underfill resin 116 according to the embodiment of FIG. 5.

Figure 7:
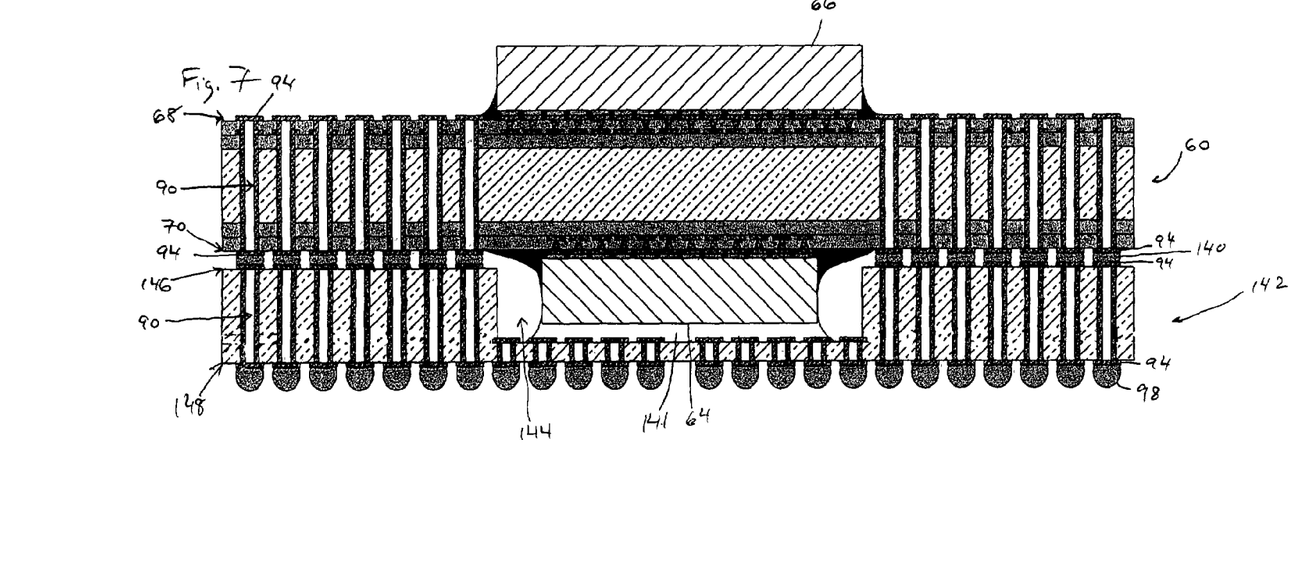
FIG. 7 is a cross-sectional view of a multi-chip module configuration in accordance with an exemplary embodiment of the present invention.

FIG. 7 illustrates another exemplary embodiment that includes a cap substrate 142, instead of a second substrate 62, that achieves the function of the thermal substrate 128 of the embodiment of FIG. 5 and the second substrate of the embodiment in FIG. 6. In contrast to the previously discussed embodiments, the cap substrate in FIG. 7 includes a recess 144, instead of a hole 106, that accommodates electronic components such as the first semiconductor die 64 and/or a decoupling capacitor (not shown). In accommodating the first semiconductor die, the dimensions of the recess are such that the first semiconductor die and the cap substrate can be coupled to the bottom surface of the first substrate without the first semiconductor die directly contacting the cap substrate.

During fabrication, the first substrate 60 and cap substrate 142 in FIG. 7 each have their through holes 90 drilled and plated separate from one another. In addition to having pads 94 on the top surface 68 of the first substrate, the bottom surface 70 of the first substrate also has pads 94 that mechanically and electrically couple to the copper-plated through holes. Further, the top surface 146 of the cap substrate includes pads 94 used to mechanically and electrically couple to the copper-plated through holes in addition to the pads 94 on the bottom surface 148 of the cap substrate. The pads 94 on the bottom surface 70 of the first substrate are coupled to pads 94 on the top surface 146 of the cap substrate by means of solder connections 140. During the fabrication process, thermal conductive material 141 is deposited between the first semiconductor die 64 and the cap substrate in the recess 144. BGA solder balls 98 are connected to the pads 94 on the bottom surface 148 of the cap substrate. The cap substrate's metal-plated through holes and pads 94 advantageously provide for thermal conduction from the first and second semiconductor dies 64 and 66, the first substrate, and the cap substrate through the BGA solder balls into the motherboard (not shown).

Further embodiments of the present invention may include an additional substrate (not shown) similar or identical to the second substrate 66 or the cap substrate 142 coupled to the top surface 68 of the first substrate 60. The additional substrate could include a hole 106 or recess 144 for accommodating the second semiconductor die 66 and could serve as a structure for coupling to another printed circuit board (not shown) positioned above the additional substrate and second semiconductor die. The additional substrate would advantageously limit the spread of underfill resin 116 away from the second semiconductor die.

Embodiments of the present invention advantageously provide a multi-chip module configuration 56 in which the substrates 60, 62, 128, and 142 allow the multi-chip module configuration to be mounted to an underlying motherboard (not shown) such that no semiconductor die 64 or 66 and/or decoupling capacitor (not shown) directly contacts the motherboard. Also, embodiments of the present invention include a second substrate having an inner wall 108 that limits the spread of underfill resin 116, thus, allowing for more of the surface area of the first substrate 60 to be used for the formation of through holes 90 and the placement of through holes closer to the first semiconductor die 64 and/or decoupling capacitor (not shown). If the dimensions of the hole 106 in the second substrate are such that the spacing between the second substrate and the first semiconductor die is less than 1.5 millimeters, the inner wall of the second substrate will mechanically limit the flow of the underfill resin to less than 1.5 millimeters away from the first semiconductor die. This is less than the typical width of spread of the underfill resin away from a semiconductor die, which may be up to 2 to 3 millimeters.

Embodiments of the present invention benefit from having through holes 90 in the substrates 60, 62, and 142 in place of microvias 102 which are more costly to fabricate. As the number of microvias increases so does the total cost to laser drill the microvias. Also, the use of metal-plated through holes in the substrates advantageously facilitates thermal conduction away from the first and second semiconductor dies 64 and 66 and substrates and into the motherboard (not shown) to which the multi-chip module configuration 10 couples. Since, in particular embodiments of the present invention, the through holes are formed through the first substrate and the second substrate after they are laminated together, these embodiments advantageously eliminate the need for multiple drilling steps and the need for alignment of the through holes that occurs when the through holes are formed separately in the first substrate and then in the second substrate. Embodiments of the present invention also provide cost savings because the need to design the substrates using fine ground rules is diminished.

Although exemplary embodiments of the present invention have been described, they should not be construed to limit the scope of the appended claims. Those skilled in the art will understand that various modifications may be made to the described embodiments. Moreover, to those skilled in the various arts, the invention itself herein will suggest solutions to other tasks and adaptations for other applications. It is therefore desired that the present embodiments be considered in all respects as illustrative and not restrictive, reference being made to the appended claims rather than the foregoing description to indicate the scope of the invention.

What is claimed is:

1. A semiconductor module comprising:
   a first substrate having a top surface with a plurality of upper interface pads disposed thereon and a bottom surface with a plurality of lower interface pads disposed thereon;
   a first electronic component coupled to the bottom surface of the first substrate, and having a top surface with a plurality of bumps electrically and face-to-face connected to the bottom interface pads;
   a second electronic component coupled to the top surface of the first substrate, and having a bottom surface with a plurality of bumps electrically and face-to-face connected to the upper interface pads; and
   a second substrate coupled to the bottom surface of the first substrate and surrounding the first electronic component, the second substrate having a ring shape with an opening formed to accommodate the first electronic component, and a bottom surface with a plurality of terminal members disposed thereon and extending below the first electronic component.

2. The semiconductor module according to claim 1, wherein each of the first and second electronic components is a semiconductor die or capacitor.

3. The semiconductor module according to claim 1, wherein the bumps of the first electronic component are coupled to the lower interface pads by a solder connection, and the bumps of the second electronic component are coupled to the upper interface pads by a solder connection.

4. The semiconductor module according to claim 1, wherein the first substrate and the second substrates include through holes each linearly and continuously formed and serving as an electrical interconnection.

5. The semiconductor module according to claim 4, wherein each of the through holes is plated with a metal.

6. The semiconductor module according to claim 4, wherein each of the terminal members of the second substrate comprises a pad and a BGA (Ball Grid Array) solder ball electrically connected thereto.

7. The semiconductor module according to claim 1, further comprising an underfill resin disposed around the first electronic component on the bottom surface of the first substrate.

8. The semiconductor module according to claim 7, wherein the second substrate has a wall adjacent the first electronic component that limits flow of the underfill resin away from the first electronic component.

9. The semiconductor module according to claim 1, further comprising an interface substrate coupled between the second electronic component and the top surface of the first substrate.

10. The semiconductor module according to claim 1, further comprising a thermal substrate disposed on the bottom surface of the second substrate.

11. The semiconductor module according to claim 10, wherein the thermal substrate has a top surface with a plurality of pads disposed thereon and electrically and face-to-face connected to the terminal members of the second substrate.

12. The semiconductor module according to claim 11, wherein the thermal substrate covers the bottom surface of the first electronic component, and a thermal conductive material is interposed between the first electronic component and the thermal substrate.

13. The semiconductor module according to claim 11, wherein the thermal substrate comprises through holes connected to the pads of the thermal substrate and each serving as an electrical interconnection.

14. The semiconductor module according to claim 13, wherein the thermal substrate has a bottom surface with BGA (Ball Grid Array) solder balls disposed thereon.

15. A semiconductor module comprising:
    a first substrate having a top surface with a plurality of upper interface pads disposed thereon and a bottom surface with a plurality of lower interface pads disposed thereon;
    a first electronic component coupled to the bottom surface of the first substrate, and having a top surface with a plurality of bumps electrically and face-to-face connected to the bottom interface pads;
    a second electronic component coupled to the top surface of the first substrate, and having a bottom surface with a plurality of bumps electrically and face-to-face connected to the upper interface pads; and
    a second substrate coupled to the bottom surface of the first substrate and covering the first electronic component, the second substrate having a ring cap shape with a recess formed to accommodate the first electronic component.

16. The semiconductor module according to claim 15, wherein each of the first and second electronic components is a semiconductor die or capacitor.

17. The semiconductor module according to claim 15, wherein the bumps of the first electronic component are coupled to the lower interface pads by a solder connection, and the bumps of the second electronic component are coupled to the upper interface pads by a solder connection.

18. The semiconductor module according to claim 15, wherein the first substrate and the second substrates include through holes each serving as an electrical interconnection.

19. The semiconductor module according to claim 18, wherein each of the through holes is plated with a metal.

20. The semiconductor module according to claim 18, wherein the second substrate has a bottom surface with BGA (Ball Grid Array) solder balls disposed thereon.

21. The semiconductor module according to claim 15, further comprising an underfill resin disposed around the first electronic component on the bottom surface of the first substrate.

22. The semiconductor module according to claim 15, further comprising a thermal conductive material interposed between the first electronic component and the second substrate.

* * * * *